United States Patent
Chi et al.

(10) Patent No.: US 8,421,210 B2
(45) Date of Patent: Apr. 16, 2013

(54) INTEGRATED CIRCUIT PACKAGING SYSTEM WITH DUAL SIDE CONNECTION AND METHOD OF MANUFACTURE THEREOF

(75) Inventors: HeeJo Chi, Ichon-si (KR); Soo Jung Park, Icheon-si (KR); Junwoo Myung, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 227 days.

(21) Appl. No.: 12/785,951

(22) Filed: May 24, 2010

(65) Prior Publication Data

US 2011/0285009 A1 Nov. 24, 2011

(51) Int. Cl.
*H01L 23/488* (2006.01)
*H01L 21/60* (2006.01)

(52) U.S. Cl.
USPC ........... 257/693; 257/690; 257/692; 257/696; 257/773; 257/778; 257/E21.502; 257/E21.511; 257/E23.023; 257/E23.031

(58) Field of Classification Search .................. 257/690, 257/692, 693, 696, 773, 778, E23.023, E23.031, 257/E21.502, E21.511; 438/111, 123, 124
See application file for complete search history.

(56) References Cited

U.S. PATENT DOCUMENTS

| 6,730,544 B1 * | 5/2004 | Yang .............................. 438/110 |
| 7,425,755 B2 * | 9/2008 | Liu ................................ 257/666 |
| 2008/0054438 A1 * | 3/2008 | Germain et al. .............. 257/690 |
| 2008/0308921 A1 * | 12/2008 | Kim ............................... 257/686 |
| 2009/0039491 A1 | 2/2009 | Kim et al. |
| 2009/0050994 A1 | 2/2009 | Ishihara et al. |
| 2009/0224381 A1 | 9/2009 | Ishihara et al. |
| 2009/0243071 A1 | 10/2009 | Ha et al. |

FOREIGN PATENT DOCUMENTS

JP 2007294634 A2 11/2007

OTHER PUBLICATIONS

Ishihara et al., A Dual Face Package Using a Post with Wire Component: Novel Structure for PoP, Wafer Level CSP and Compact Image Sensor Packages, 2008 Proceedings 58th Electronic Components and Technology Conference, May 27-30, 2008, p. 1093-1098, Institute of Electrical and Electronics Engineers ( IEEE ), Lake Buena Vista, Florida, United States.
U.S. Appl. No. 12/412,312, filed Mar. 26, 2009, Pagaila et al.

* cited by examiner

*Primary Examiner* — Peniel M Gumedzoe
(74) *Attorney, Agent, or Firm* — Ishimaru & Associates LLP

(57) ABSTRACT

A method of manufacture of an integrated circuit packaging system includes: forming a first terminal; connecting an integrated circuit to the first terminal; forming a second terminal connected over the first terminal and the integrated circuit by a vertical conductive post integral with the first terminal or the second terminal; and encapsulating the integrated circuit and the vertical conductive post leaving portions of the first terminal and the second terminal exposed.

20 Claims, 10 Drawing Sheets

INTEGRATED CIRCUIT PACKAGING SYSTEM WITH DUAL SIDE CONNECTION AND METHOD OF MANUFACTURE THEREOF

TECHNICAL FIELD

The present invention relates generally to an integrated circuit packaging system, and more particularly to a system for an integrated circuit packaging system with dual side connection.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for performance, integration, and cost reduction.

Thus, a need still remains for an integrated circuit packaging system providing improved chip interconnection and space savings. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a first terminal; connecting an integrated circuit to the first terminal; forming a second terminal connected over the first terminal and the integrated circuit by a vertical conductive post integral with the first terminal or the second terminal; and encapsulating the integrated circuit and the vertical conductive post leaving portions of the first terminal and the second terminal exposed.

The present invention provides an integrated circuit packaging system, including: a first terminal; an integrated circuit connected to the first terminal; a second terminal over the first terminal and the integrated circuit; a vertical conductive post connected to the first terminal and the second terminal, the vertical conductive post integral with the first terminal or the second terminal; and an encapsulation covering the integrated circuit and the vertical conductive post leaving portions of the first terminal and the second terminal exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
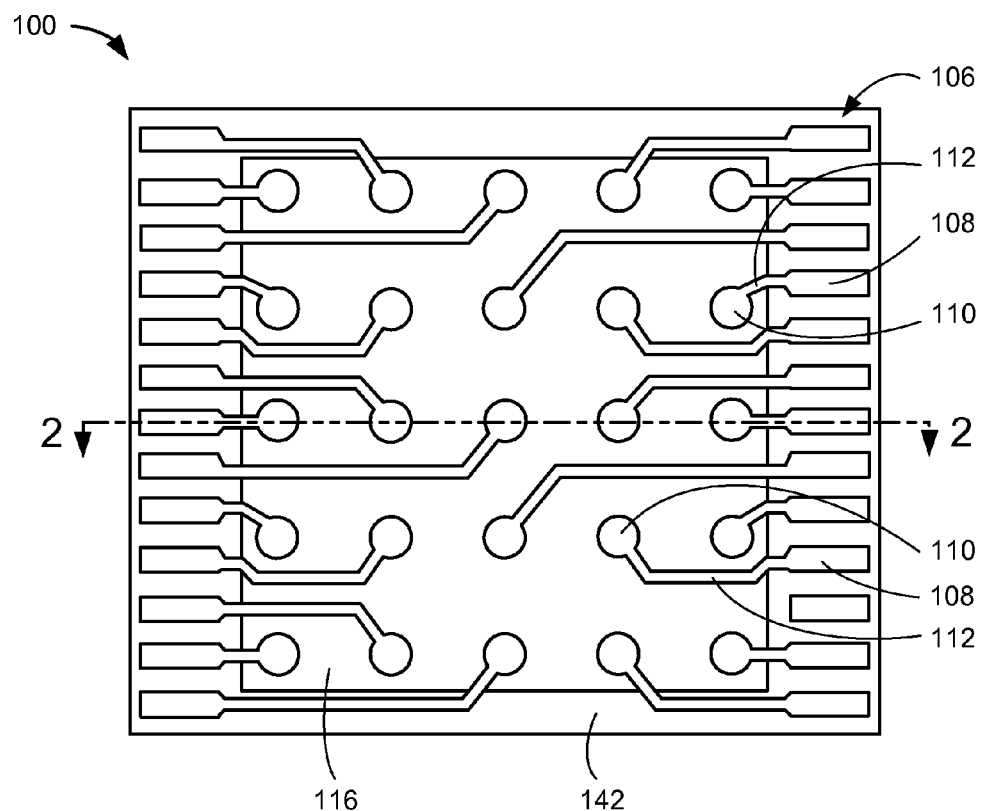
FIG. 1 is a bottom view of an integrated circuit packaging system in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Referring now to FIG. 1, therein is shown a bottom view of an integrated circuit packaging system 100 in a first embodiment of the present invention. The integrated circuit packaging system 100 can represent a configuration of a packaging system, which can include a dual face package-on-package (PoP) system with dual strip-etch leadframes as a base non-laminated substrate and an interposer with a metal post. For illustrative purposes, the bottom view is shown without a connector for providing connectivity to external systems.

The integrated circuit packaging system 100 can include a first terminal 106, defined as an interconnect that provides electrical connectivity to external systems. The first terminal 106 can include a first lead 108, more specifically a bond finger, a lead finger, or a contact pad.

The first terminal 106 can include a first pad 110, more specifically a contact pad, a lead, or an electrical contact, connected to the first lead 108. The first pad 110 can be formed in an area array.

For illustrative purposes, the first pad 110 is shown in a full area array, although the first pad 110 can be formed in a different configuration. For example, the first pad 110 can be formed in a peripheral array adjacent to the first lead 108.

The first terminal 106 can include a first trace 112, more specifically a signal trace or a wire, connected to the first lead 108 and the first pad 110. The first trace 112 can be formed to provide electrical connectivity between the first lead 108 and the first pad 110.

The first trace 112 can be formed in different configurations. For example, the first trace 112 can be formed with different lengths. A length of the first trace 112 can be predetermined based on locations of the first lead 108 and the first pad 110, a distance between the first lead 108 and the first pad 110, a routing area that is used to form the first trace 112, or a combination thereof.

The integrated circuit packaging system 100 can include an attach layer 116, more specifically an adhesive film, an epoxy, or an adhesive. For example, the attach layer 116 can be formed with a material that is similar to a wire in film (WIF). The first pad 110 and the first trace 112 can be partially exposed from the attach layer 116.

The integrated circuit packaging system 100 can include an encapsulation 142, more specifically a cover including an epoxy molding compound (EMC) or a molding material. The first terminal 106 and the attach layer 116 can be partially exposed from the encapsulation 142. The first lead 108, the first pad 110, and the first trace 112 can be partially exposed from the encapsulation 142.

The first lead 108 can be formed in a row. For illustrative purposes, the first lead 108 is shown in two rows along sides of the encapsulation 142, although the first lead 108 can be formed in a different configuration. For example, the first lead 108 can be formed in four rows along the sides.

Figure 2:
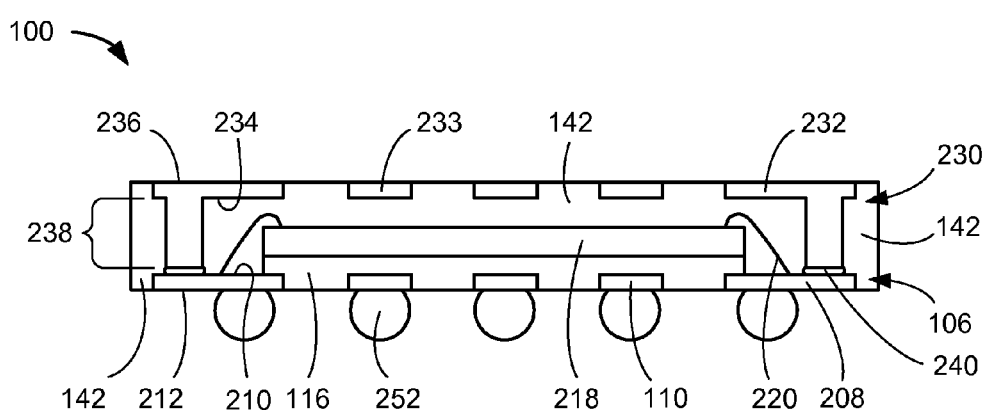
FIG. 2 is a cross-sectional view of the integrated circuit packaging system along a section line 2-2 of FIG. 1.

Referring now to FIG. 2, therein is shown a cross-sectional view of the integrated circuit packaging system 100 along a section line 2-2 of FIG. 1. The first terminal 106 can include a first horizontal portion 208. The first horizontal portion 208 can include the first lead 108 of FIG. 1, the first pad 110, and the first trace 112 of FIG. 1.

The first horizontal portion 208 can have a first non-exposed side 210 and a first exposed side 212 opposite the first non-exposed side 210. The first non-exposed side 210 is covered by or within the encapsulation 142. The first exposed side 212 is exposed from the encapsulation 142.

The first exposed side 212 can be coplanar with the encapsulation 142. The attach layer 116 can be formed over the first non-exposed side 210.

An integrated circuit 218, more specifically an integrated circuit die, a wirebond integrated circuit, or a chip, can be mounted over the first non-exposed side 210. The integrated circuit 218 can be above a plane of the first non-exposed side 210.

The integrated circuit 218 can be attached to the first non-exposed side 210 with the attach layer 116. The integrated circuit 218 can be over the first pad 110 and a portion of the first trace 112.

An internal connector 220, more specifically a bond wire, a ribbon bond wire, or a conductive wire, can be connected to the first horizontal portion 208 and the integrated circuit 218. The internal connector 220 can be connected to the first non-exposed side 210.

The integrated circuit packaging system 100 can include a second terminal 230, defined as an interconnect that provides electrical connectivity to external systems. The second terminal 230 can include a second horizontal portion 232.

The second horizontal portion 232 can include a second lead electrically connected to a second pad 233 with a second trace. For illustrative purposes, the second horizontal portion 232 is shown adjacent to the second pad 233 of another of the second horizontal portion 232.

The second lead is more specifically a bond finger, a lead finger, or a contact pad. The second pad 233 is more specifically a contact pad, a lead, or an electrical contact. The second pad 233 can be formed in an area array or a peripheral array adjacent to the second lead.

The second trace is more specifically a signal trace or a wire. The second trace can be formed in different configurations.

For example, the second trace can be formed with different lengths. A length of the second trace can be predetermined based on locations of the second lead and the second pad 233, a distance between the second lead and the second pad 233, a routing area that is used to form the second trace, or a combination thereof.

The second horizontal portion 232 can have a second non-exposed side 234 and a second exposed side 236 opposite the second non-exposed side 234. The second non-exposed side 234 is covered by or within the encapsulation 142. The second exposed side 236 is exposed from the encapsulation 142. The second exposed side 236 can be coplanar with the encapsulation 142.

The second terminal 230 can include a second vertical conductive post 238, more specifically a metal post, a vertical interconnect (also known as a z-interconnect), a pillar, a column, or a conductive connector. The second vertical conductive post 238 can be connected to the second horizontal portion 232.

The second vertical conductive post 238 can be integral with the second horizontal portion 232. In other words, the second vertical conductive post 238 and the second horizontal portion 232 can be formed of a common material having characteristics being formed from a single integral structure or a solid structure.

The second terminal 230 can be mounted over the first terminal 106 and the integrated circuit 218 by the second vertical conductive post 238 adjacent to the integrated circuit 218. The second vertical conductive post 238 can be mounted over the first horizontal portion 208. The second pad 233 and a portion of the second trace can be over the integrated circuit 218.

The second vertical conductive post 238 can be attached to the first horizontal portion 208 with a conductive material 240, more specifically a paste or an adhesive that is used to form a joint. For example, the conductive material 240 can be a solder paste, a metallic paste, or a conductive adhesive.

The conductive material 240 can be formed to provide electrical connectivity between the first horizontal portion 208 and the second vertical conductive post 238. The conductive material 240 can be connected to the first non-exposed side 210 and the second vertical conductive post 238.

The encapsulation 142 can be formed over the first terminal 106 to encapsulate or cover the integrated circuit 218 and the second vertical conductive post 238, leaving portions of the first terminal 106 and the second terminal 230 exposed. The first horizontal portion 208 and the second horizontal portion 232 can be partially exposed from the encapsulation 142.

The integrated circuit packaging system 100 can optionally include an external interconnect 252, more specifically a ball, a bump, or a connector. The external interconnect 252 can be attached to the first exposed side 212 to provide connectivity to external systems (not shown).

Another of the first terminal 106 can be formed adjacent to the first terminal 106. The integrated circuit 218 can be mounted partially over the first horizontal portion 208 of the first terminal 106 and a first horizontal portion 208 of the another of the first terminal 106. The integrated circuit 218 can be connected to a first non-exposed side 210 of the first horizontal portion 208 of the another of the first terminal 106 with another of the internal connector 220.

Another of the second terminal 230 can be formed adjacent to the second terminal 230. The second horizontal portion 232 of the second terminal 230 and a second horizontal portion 232 of the another of the second terminal 230 can be mounted partially over the integrated circuit 218.

It has been discovered that the integrated circuit packaging system 100 improves reliability. The second terminal 230, having the second horizontal portion 232 and the second vertical conductive post 238 integrated as an integral unit, provides a robust structure that is less susceptible to mechanical failure than a structure made with discrete parts. With the robust structure, the second terminal 230 is reliably mounted over the first terminal 106, thereby improving the reliability.

Figure 3:
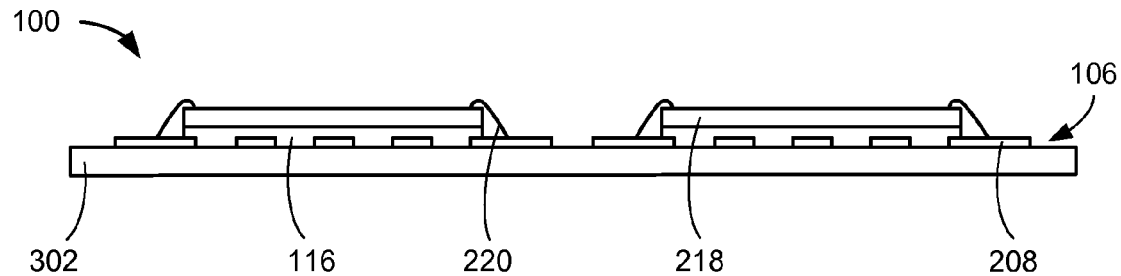
FIG. 3 is a cross-sectional view of the integrated circuit packaging system in an integrated circuit attaching phase of manufacture.

Referring now to FIG. 3, therein is shown a cross-sectional view of the integrated circuit packaging system 100 in an integrated circuit attaching phase of manufacture. The integrated circuit packaging system 100 can include a first base portion 302, more specifically a lead-frame base, a strip, a panel, a wafer, or a plate. The first base portion 302 can be formed with a metal or a metallic alloy.

The first terminal 106 can be formed on the first base portion 302. For example, the first terminal 106 can be formed with a leadframe infrastructure. Also for example, the first terminal 106 can be formed with etching, stamping, cutting, chemical milling, or any combination thereof.

The first horizontal portion 208 can be formed on the first base portion 302. The attach layer 116 can be formed over the first horizontal portion 208.

Although not shown, the first horizontal portion 208 can be formed with a number of layers. For example, the first horizontal portion 208 can be formed with an etching protection layer, an adhesion layer, a diffusion barrier layer, a wet-enhancing layer, or a combination thereof.

The integrated circuit 218 can be attached to the first terminal 106 with the attach layer 116. The integrated circuit 218 can be connected to the first horizontal portion 208 with the internal connector 220.

For illustrative purposes, the cross-sectional view is shown with the first terminal 106 formed, although the second terminal 230 of FIG. 2 and the first terminal 106 can be concurrently formed. For example, the second terminal 230 and the first terminal 106 can be formed at the same time in an etching process before the second terminal 230 is mounted in subsequent processes.

Figure 4A:
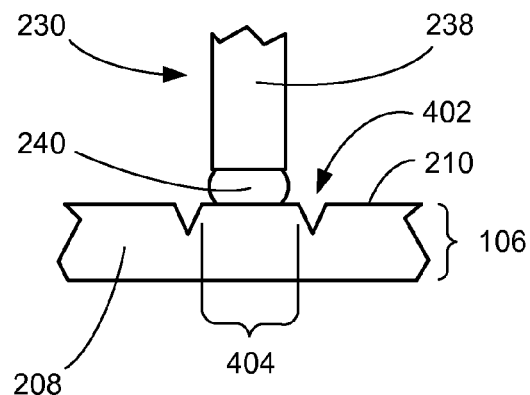
FIG. 4A is a portion of the structure of FIG. 3 in a first lead forming process.

Referring now to FIG. 4A, therein is shown a portion of the structure of FIG. 3 in a first lead forming process. The first terminal 106 can be formed with a structure that can prevent problems in subsequent manufacture phases. For example, the problems can include bleed out problems that can occur with soldering or epoxy dispensing.

The first lead forming process can include the first terminal 106 formed with a cavity ring 402, more specifically a dent or a groove around an attach region 404 of the first terminal 106 and is formed to avoid the conductive material 240 from bleeding or flowing out of the attach region 404. The attach region 404 is more specifically a portion at the first non-exposed side 210 of the first horizontal portion 208 where the second terminal 230 is attached to the first terminal 106.

The second vertical conductive post 238 can be surrounded by the cavity ring 402. For ease of description, the first lead forming process is shown with the second vertical conductive post 238 attached to the attach region 404 with the conductive material 240, although a process of attaching the second terminal 230 is not described until later in a subsequent manufacture phase.

Figure 4B:
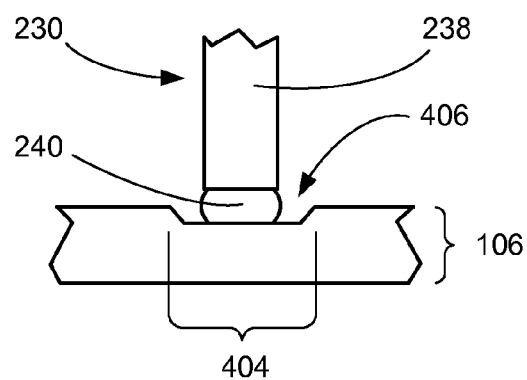
FIG. 4B is a portion of the structure of FIG. 3 in a second lead forming process.

Referring now to FIG. 4B, therein is shown a portion of the structure of FIG. 3 in a second lead forming process. The second lead forming process can include the first terminal 106 formed with a recess 406, more specifically a hollow or an indentation at the attach region 404 and is formed to avoid the conductive material 240 from bleeding or flowing out of the attach region 404.

The second vertical conductive post 238 can be connected to the first terminal 106 in the recess 406. For ease of description, the second lead forming process is shown with the second vertical conductive post 238 attached to the attach region 404 with the conductive material 240, although a process of attaching the second terminal 230 is not described until later in a subsequent manufacture phase.

Figure 5:
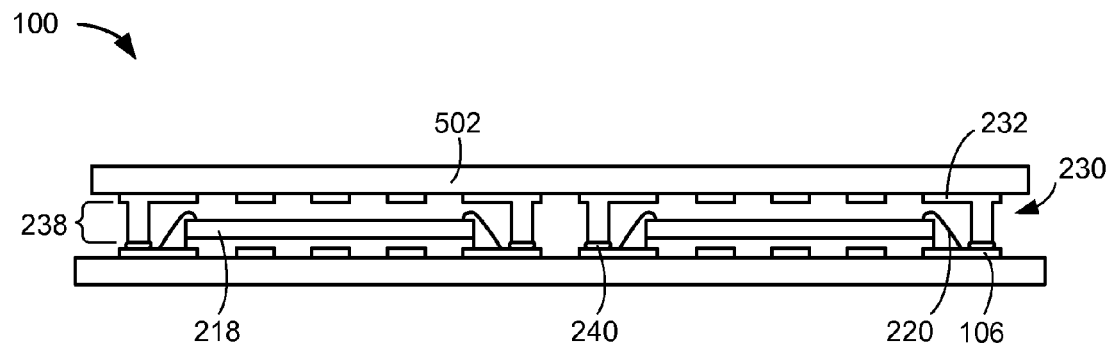
FIG. 5 is the structure of FIG. 3 in a second terminal attaching phase.

Referring now to FIG. 5, therein is shown the structure of FIG. 3 in a second terminal attaching phase. The integrated circuit packaging system 100 can include a second base portion 502, more specifically a lead-frame base, a strip, a panel, a wafer, or a plate. The second base portion 502 can be formed with a metal or a metallic alloy.

The second terminal 230 can be formed on the second base portion 502. For example, the second terminal 230 can be formed with a leadframe infrastructure. Also for example, the second terminal 230 can be formed with etching, stamping, cutting, chemical milling, or any combination thereof.

The second terminal 230 can be mounted over the first terminal 106 and the integrated circuit 218. The conductive material 240 can be attached to the second terminal 230 and the first terminal 106. The second vertical conductive post 238 and the first terminal 106 can be attached with the conductive material 240.

The conductive material 240 can be formed with a method including printing, dipping, dispensing, or any other attaching method. For example, the method can include solder paste printing, pre solder dipping (e.g. hot/wave pot), or epoxy syringe dispensing.

The second horizontal portion 232 can be on the second base portion 502 and away from the first terminal 106. Although not shown, the second horizontal portion 232 can be formed with a number of layers. For example, the second horizontal portion 232 can be formed with an etching protection layer, an adhesion layer, a diffusion barrier layer, a wet-enhancing layer, or a combination thereof.

The second vertical conductive post 238 can be adjacent to the internal connector 220. With the second vertical conductive post 238 and the internal connector 220 connected to the first terminal 106, the second vertical conductive post 238 can be electrically connected to the internal connector 220.

Figure 6:
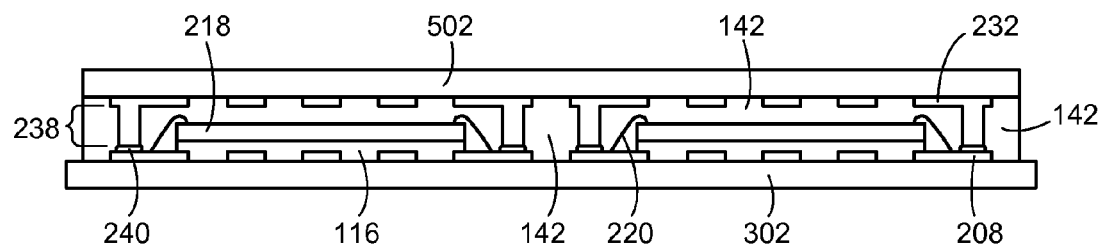
FIG. 6 is the structure of FIG. 5 in a molding phase.

Referring now to FIG. 6, therein is shown the structure of FIG. 5 in a molding phase. The encapsulation 142 can be formed between the first base portion 302 and the second base portion 502.

The encapsulation 142 can be formed to encapsulate or cover the attach layer 116, the integrated circuit 218, the internal connector 220, the second vertical conductive post 238, and the conductive material 240. The encapsulation 142 can partially cover the first horizontal portion 208 and the second horizontal portion 232.

Figure 7:
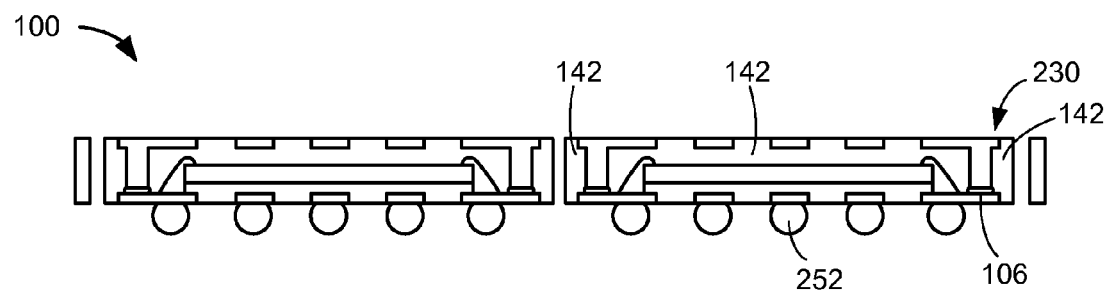
FIG. 7 is the structure of FIG. 6 in a singulation phase.

Referring now to FIG. 7, therein is shown the structure of FIG. 6 in a singulation phase. The first base portion 302 of FIG. 3 and the second base portion 502 of FIG. 5 can be removed. The first base portion 302 and the second base portion 502 can be removed by etching, grinding, sanding, or any other mechanical or chemical means.

The first terminal 106, the encapsulation 142, and the second terminal 230 can include characteristics of the first base portion 302 and the second base portion 502 removed. The characteristics can include an etched surface, grinding marks, sanding marks, other removal tool marks, chemical residue, or a chemically processed surface.

Package singulation can be performed to complete a package assembly of the integrated circuit packaging system 100. Singulation can include mechanical or optical means, such as cutting, sawing, laser scribing, or any other singulation processes, to produce individual package units of the integrated circuit packaging system 100.

The integrated circuit packaging system 100 can optionally include the external interconnect 252 as well as surface mount (S/M) treatment for enhancing solder ball mount (SBM) quality. The external interconnect 252 can be connected to the first terminal 106. The external interconnect 252 can be formed with solder, an alloy, or a conductive material.

Figure 8:
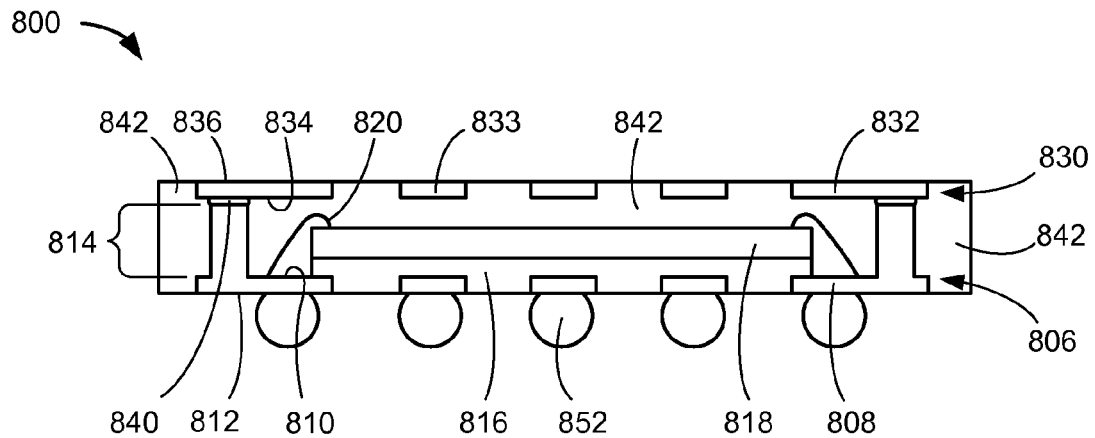
FIG. 8 is a cross-sectional view as exemplified by the bottom view of FIG. 1 of an integrated circuit packaging system in a second embodiment of the present invention.

Referring now to FIG. 8, therein is shown a cross-sectional view as exemplified by the bottom view of FIG. 1 of an integrated circuit packaging system 800 in a second embodiment of the present invention. The integrated circuit packaging system 800 can represent a configuration of a packaging system, which can include a dual face package-on-package (PoP) system with dual strip-etch leadframes and a metal post at a bottom leadframe base.

The integrated circuit packaging system 800 can be formed in a manner similar to the integrated circuit packaging system 100 of FIG. 1, except for the formation of the first terminal 106 of FIG. 1, the second terminal 230 of FIG. 2, the conductive material 240 of FIG. 2, and the encapsulation 142 of FIG. 1.

The integrated circuit packaging system 800 can include a first terminal 806 having a first horizontal portion 808. The first horizontal portion 808 can include a first non-exposed side 810 and a first exposed side 812. The first horizontal portion 808 can be formed in a manner similar to the first horizontal portion 208 of FIG. 2.

The first terminal 806 can include a first vertical conductive post 814, more specifically a metal post, a vertical interconnect (also known as a z-interconnect), a pillar, a column, or a conductive connector. The first vertical conductive post 814 can be connected to the first horizontal portion 808.

The first vertical conductive post 814 can be integral with the first horizontal portion 808. In other words, the first vertical conductive post 814 and the first horizontal portion 808 can be formed of a common material having characteristics being formed from a single integral structure or a solid structure.

The integrated circuit packaging system 800 can include an attach layer 816, an integrated circuit 818, and an internal connector 820. The attach layer 816, the integrated circuit 818, and the internal connector 820 can be formed in a manner similar to the attach layer 116 of FIG. 1, the integrated circuit 218 of FIG. 2, and the internal connector 220 of FIG. 2, respectively.

The integrated circuit packaging system 800 can include a second terminal 830 having a second horizontal portion 832. The second horizontal portion 832 can include a second lead, a second pad 833, and a second trace.

The second horizontal portion 832 can include a second non-exposed side 834 and a second exposed side 836. The second horizontal portion 832 can be formed in a manner similar to the second horizontal portion 232 of FIG. 2.

The second terminal 830 can be mounted over the first terminal 806 and the integrated circuit 818. The second terminal 830 can be mounted over the first vertical conductive post 814 adjacent to the integrated circuit 818.

The second terminal 830 can be attached to the first terminal 806 with a conductive material 840, more specifically a paste or an adhesive that is used to form a joint. For example, the conductive material 840 can be a solder paste, a metallic paste, or a conductive adhesive.

The conductive material 840 can be formed to provide electrical connectivity between the first terminal 806 and the second terminal 830. The conductive material 840 can be connected to the first vertical conductive post 814 and the second horizontal portion 832.

The first vertical conductive post 814 can be adjacent to the internal connector 820. With the second terminal 830 and the internal connector 820 connected to the first terminal 106, the second terminal 830 can be electrically connected to the internal connector 820.

The integrated circuit packaging system 800 can include an encapsulation 842, more specifically a cover including an epoxy molding compound (EMC) or a molding material. The encapsulation 842 can be formed over the first terminal 806. The encapsulation 842 can be formed to encapsulate or cover the first vertical conductive post 814, the attach layer 816, the integrated circuit 818, the internal connector 820, and the conductive material 840.

The encapsulation 842 can be formed leaving portions of the first terminal 806 and the second terminal 830 exposed. The first horizontal portion 808 and the second horizontal portion 832 can be partially exposed from the encapsulation 842.

The integrated circuit packaging system 800 can optionally include an external interconnect 852. The external interconnect 852 can be formed in a manner similar to the external interconnect 252 of FIG. 2.

Another of the first terminal 806 can be formed adjacent to the first terminal 806. The integrated circuit 818 can be mounted partially over the first horizontal portion 808 of the first terminal 806 and a first horizontal portion 808 of the another of the first terminal 806. The integrated circuit 818 can be connected to a first non-exposed side 810 of the first horizontal portion 808 of the another of the first terminal 806 with another of the internal connector 820.

Another of the second terminal 830 can be formed adjacent to the second terminal 830. The second horizontal portion 832 of the second terminal 830 and a second horizontal portion 832 of the another of the second terminal 830 can be mounted partially over the integrated circuit 818.

Figure 9:
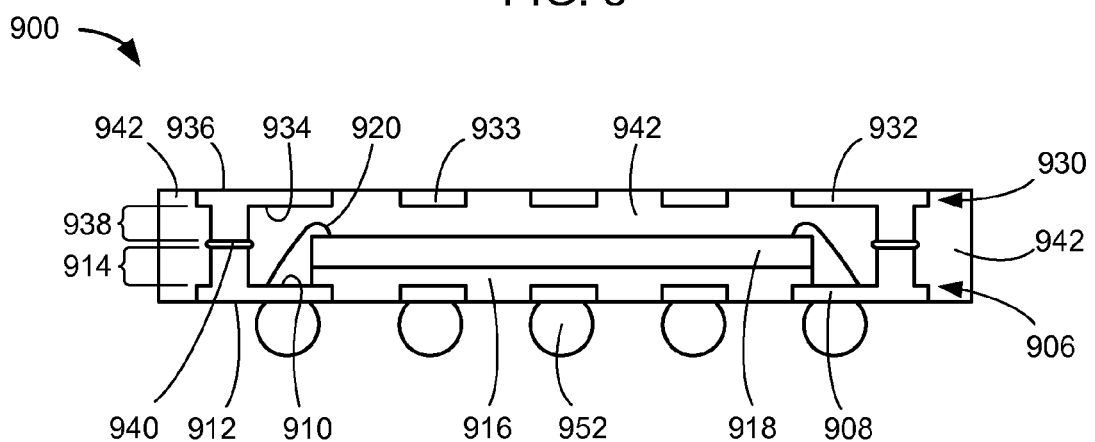
FIG. 9 is a cross-sectional view as exemplified by the bottom view of FIG. 1 of an integrated circuit packaging system in a third embodiment of the present invention.

Referring now to FIG. 9, therein is shown a cross-sectional view as exemplified by the bottom view of FIG. 1 of an integrated circuit packaging system 900 in a third embodiment of the present invention. The integrated circuit packaging system 900 can represent a configuration of a packaging system, which can include a dual face package-on-package (PoP) system with dual strip-etch leadframes and metal posts at top and bottom leadframe bases.

The integrated circuit packaging system 900 can be formed in a manner similar to the integrated circuit packaging system 100 of FIG. 1, except for the formation of the first terminal 106 of FIG. 1, the conductive material 240 of FIG. 2, and the encapsulation 142 of FIG. 1.

The integrated circuit packaging system 900 can include a first terminal 906 having a first horizontal portion 908. The first horizontal portion 908 can include a first non-exposed side 910 and a first exposed side 912. The first horizontal portion 908 can be formed in a manner similar to the first horizontal portion 208 of FIG. 2.

The first terminal 906 can include a first vertical conductive post 914, more specifically a metal post, a vertical interconnect (also known as a z-interconnect), a pillar, a column, or a conductive connector. The first vertical conductive post 914 can be connected to the first horizontal portion 908.

The first vertical conductive post 914 can be integral with the first horizontal portion 908. In other words, the first vertical conductive post 914 and the first horizontal portion 908 can be formed of a common material having characteristics being formed from a single integral structure or a solid structure.

The integrated circuit packaging system 900 can include an attach layer 916, an integrated circuit 918, and an internal connector 920. The attach layer 916, the integrated circuit 918, and the internal connector 920 can be formed in a manner similar to the attach layer 116 of FIG. 1, the integrated circuit 218 of FIG. 2, and the internal connector 220 of FIG. 2, respectively.

The integrated circuit packaging system 900 can include a second terminal 930 having a second horizontal portion 932. The second horizontal portion 932 can include a second lead, a second pad 933, and a second trace.

The second horizontal portion 932 can include a second non-exposed side 934 and a second exposed side 936. The second terminal 930 can include a second vertical conductive post 938.

The second terminal 930 can be formed in a manner similar to the second terminal 230 of FIG. 2. The second terminal 930 can be mounted over the first terminal 906. The second vertical conductive post 938 can be mounted over the first vertical conductive post 914 adjacent to the integrated circuit 918.

The second terminal 930 can be attached to the first terminal 906 with a conductive material 940, more specifically a paste or an adhesive that is used to form a joint. For example, the conductive material 940 can be a solder paste, a metallic paste, or a conductive adhesive.

The conductive material 940 can be formed to provide electrical connectivity between the first terminal 906 and the second terminal 930. The conductive material 940 can be attached to the first vertical conductive post 914 and the second vertical conductive post 938.

The first vertical conductive post 914 and the second vertical conductive post 938 can be adjacent to the internal connector 920. With the second terminal 930 and the internal connector 920 connected to the first terminal 106, the second terminal 930 can be electrically connected to the internal connector 920.

The integrated circuit packaging system 900 can include an encapsulation 942, more specifically a cover including an epoxy molding compound (EMC) or a molding material. The encapsulation 942 can be formed over the first terminal 906. The encapsulation 942 can be formed to encapsulate or cover the first vertical conductive post 914, the attach layer 916, the integrated circuit 918, the internal connector 920, the second vertical conductive post 938, and the conductive material 940.

The encapsulation 942 can be formed leaving portions of the first terminal 906 and the second terminal 930 exposed. The first horizontal portion 908 and the second horizontal portion 932 can be partially exposed from the encapsulation 942.

The integrated circuit packaging system 900 can optionally include an external interconnect 952. The external interconnect 952 can be formed in a manner similar to the external interconnect 252 of FIG. 2.

Another of the first terminal 906 can be formed adjacent to the first terminal 906. The integrated circuit 918 can be mounted partially over the first horizontal portion 908 of the first terminal 906 and a first horizontal portion 908 of the another of the first terminal 906. The integrated circuit 918 can be connected to a first non-exposed side 910 of the first horizontal portion 908 of the another of the first terminal 906 with another of the internal connector 920.

Another of the second terminal 930 can be formed adjacent to the second terminal 930. The second horizontal portion 932 of the second terminal 930 and a second horizontal portion 932 of the another of the second terminal 930 can be mounted partially over the integrated circuit 918.

Figure 10:
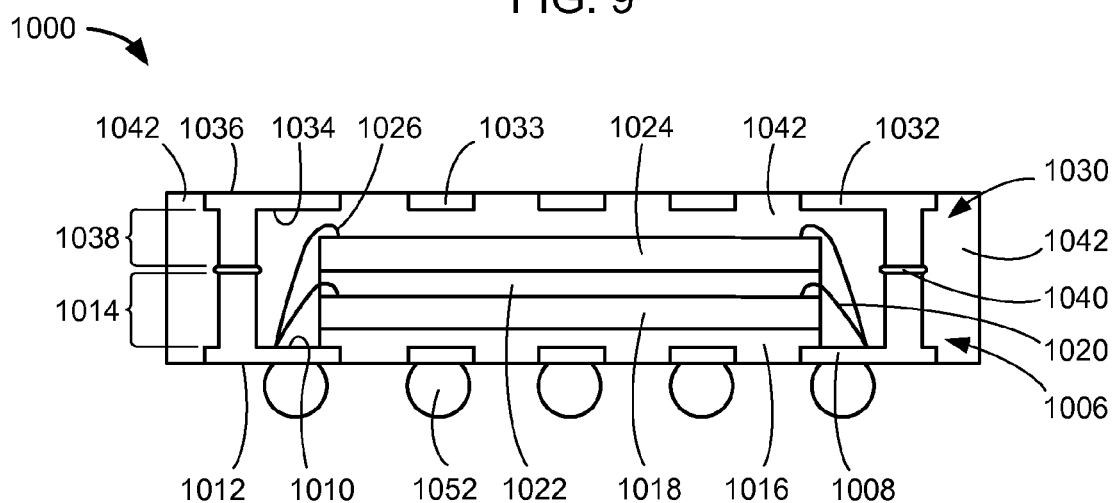
FIG. 10 is a cross-sectional view as exemplified by the bottom view of FIG. 1 of an integrated circuit packaging system in a fourth embodiment of the present invention.

Referring now to FIG. 10, therein is shown a cross-sectional view as exemplified by the bottom view of FIG. 1 of an integrated circuit packaging system 1000 in a fourth embodiment of the present invention. The integrated circuit packaging system 1000 can represent a configuration of a packaging system, which can include a dual face package-on-package (PoP) system with dual strip-etch leadframes and a multi-chip stack. The integrated circuit packaging system 1000 can be formed in a manner similar to the integrated circuit packaging system 100 of FIG. 1, except for the formation of the first terminal 106 of FIG. 1, the conductive material 240 of FIG. 2, the encapsulation 142 of FIG. 1, and an addition of another integrated circuit.

The integrated circuit packaging system 1000 can include a first terminal 1006 having a first horizontal portion 1008. The first horizontal portion 1008 can include a first non-exposed side 1010 and a first exposed side 1012. The first horizontal portion 1008 can be formed in a manner similar to the first horizontal portion 208 of FIG. 2.

The first terminal 1006 can include a first vertical conductive post 1014, more specifically a metal post, a vertical interconnect (also known as a z-interconnect), a pillar, a column, or a conductive connector. The first vertical conductive post 1014 can be connected to the first horizontal portion 1008.

The first vertical conductive post 1014 can be integral with the first horizontal portion 1008. In other words, the first vertical conductive post 1014 and the first horizontal portion 1008 can be formed of a common material having characteristics being formed from a single integral structure or a solid structure.

The integrated circuit packaging system 1000 can include an attach layer 1016, an integrated circuit 1018, and an internal connector 1020. The attach layer 1016, the integrated circuit 1018, and the internal connector 1020 can be formed in a manner similar to the attach layer 116 of FIG. 1, the integrated circuit 218 of FIG. 2, and the internal connector 220 of FIG. 2, respectively.

The integrated circuit packaging system 1000 can include a second attach layer 1022, more specifically a film, an epoxy, or an adhesive, formed over the integrated circuit 1018. A second integrated circuit 1024, more specifically an integrated circuit die, a wirebond integrated circuit, or a chip, can be mounted over the integrated circuit 1018. The second integrated circuit 1024 can be attached to the integrated circuit 1018 with the second attach layer 1022.

A second internal connector 1026, more specifically a bond wire, a ribbon bond wire, or a conductive wire, can be connected to the first terminal 1006 and the second integrated circuit 1024. The second internal connector 1026 can be connected to the first horizontal portion 1008.

The integrated circuit packaging system 1000 can include a second terminal 1030 having a second horizontal portion 1032. The second horizontal portion 1032 can include a second lead, a second pad 1033, and a second trace.

The second horizontal portion 1032 can include a second non-exposed side 1034 and a second exposed side 1036. The second terminal 1030 can include a second vertical conductive post 1038.

The second terminal 1030 can be formed in a manner similar to the second terminal 230 of FIG. 2. The second terminal 1030 can be mounted over the first terminal 1006. The second vertical conductive post 1038 can be mounted over the first vertical conductive post 1014 adjacent to the integrated circuit 1018.

The second terminal 1030 can be attached to the first terminal 1006 with a conductive material 1040, more specifically a paste or an adhesive that is used to form a joint. For example, the conductive material 1040 can be a solder paste, a metallic paste, or a conductive adhesive.

The conductive material 1040 can be formed to provide electrical connectivity between the first terminal 1006 and the second terminal 1030. The conductive material 1040 can be connected to the first vertical conductive post 1014 and the second vertical conductive post 1038.

The first vertical conductive post 1014 can be adjacent to the internal connector 1020 and the second internal connector 1026. The second vertical conductive post 1038 can be adjacent to the second internal connector 1026. With the second terminal 1030, the internal connector 1020, and the second internal connector 1026 connected to the first terminal 1006, the second terminal 1030 can be electrically connected to the internal connector 1020 and the second internal connector 1026.

The integrated circuit packaging system 1000 can include an encapsulation 1042, more specifically a cover including an epoxy molding compound (EMC) or a molding material. The encapsulation 1042 can be formed over the first terminal 1006. The encapsulation 1042 can be formed to encapsulate or cover the first vertical conductive post 1014, the attach layer 1016, the integrated circuit 1018, the internal connector 1020, the second attach layer 1022, the second integrated circuit 1024, the second internal connector 1026, the second vertical conductive post 1038, and the conductive material 1040.

The encapsulation 1042 can be formed leaving portions of the first terminal 1006 and the second terminal 1030 exposed. The first horizontal portion 1008 and the second horizontal portion 1032 can be partially exposed from the encapsulation 1042.

The integrated circuit packaging system 1000 can optionally include an external interconnect 1052. The external interconnect 1052 can be formed in a manner similar to the external interconnect 252 of FIG. 2.

Another of the first terminal 1006 can be formed adjacent to the first terminal 1006. The integrated circuit 1018 can be mounted partially over the first horizontal portion 1008 of the first terminal 1006 and a first horizontal portion 1008 of the another of the first terminal 1006. The integrated circuit 1018 can be connected to a first non-exposed side 1010 of the first horizontal portion 1008 of the another of the first terminal 1006 with another of the internal connector 1020.

Another of the second terminal 1030 can be formed adjacent to the second terminal 1030. The second horizontal portion 1032 of the second terminal 1030 and a second horizontal portion 1032 of the another of the second terminal 1030 can be mounted partially over the integrated circuit 1018.

Figure 11:
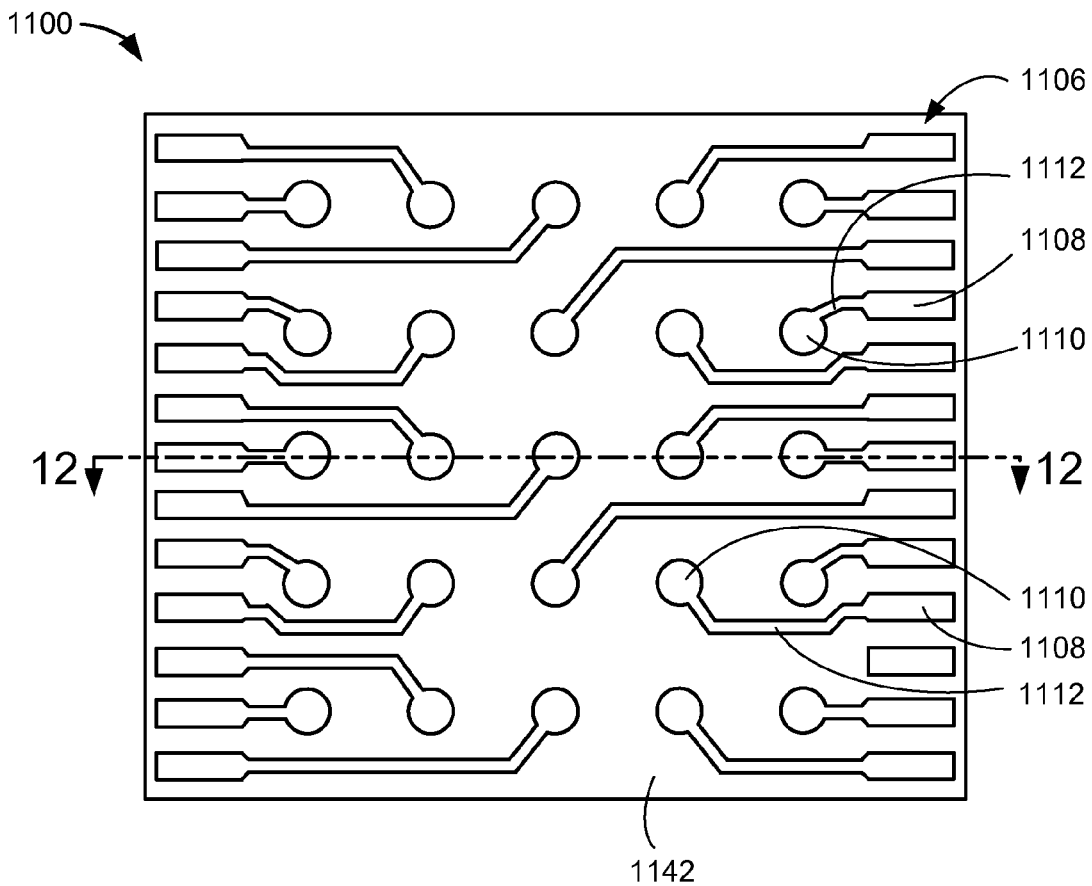
FIG. 11 is a bottom view of an integrated circuit packaging system in a fifth embodiment of the present invention.

Referring now to FIG. 11, therein is shown a bottom view of an integrated circuit packaging system 1100 in a fifth embodiment of the present invention. The integrated circuit packaging system 1100 can represent a configuration of a packaging system, which can include a dual face package-on-package (PoP) system with dual strip-etch leadframes and a flip-chip. For illustrative purposes, the bottom view is shown without a connector for providing connectivity to external systems.

The integrated circuit packaging system 1100 can include a first terminal 1106, defined as an interconnect that provides electrical connectivity to external systems. The first terminal 1106 can include a first lead 1108, more specifically a bond finger, a lead finger, or a contact pad.

The first terminal 1106 can include a first pad 1110, more specifically a contact pad, a lead, or an electrical contact, connected to the first lead 1108. The first pad 1110 can be formed in an area array.

For illustrative purposes, the first pad 1110 is shown in a full area array, although the first pad 1110 can be formed in a different configuration. For example, the first pad 1110 can be formed in a peripheral array adjacent to the first lead 1108.

The first terminal 1106 can include a first trace 1112, more specifically a signal trace or a wire, connected to the first lead 1108 and the first pad 1110. The first trace 1112 can be formed to provide electrical connectivity between the first lead 1108 and the first pad 1110.

The integrated circuit packaging system 1100 can include an encapsulation 1142, more specifically a cover including an epoxy molding compound (EMC) or a molding material. The first terminal 1106 can be partially exposed from the encapsulation 1142.

The first lead 1108 can be formed in a row. For illustrative purposes, the first lead 1108 is shown in two rows along sides of the encapsulation 1142, although the first lead 1108 can be formed in a different configuration. For example, the first lead 1108 can be formed in four rows along the sides.

Figure 12:
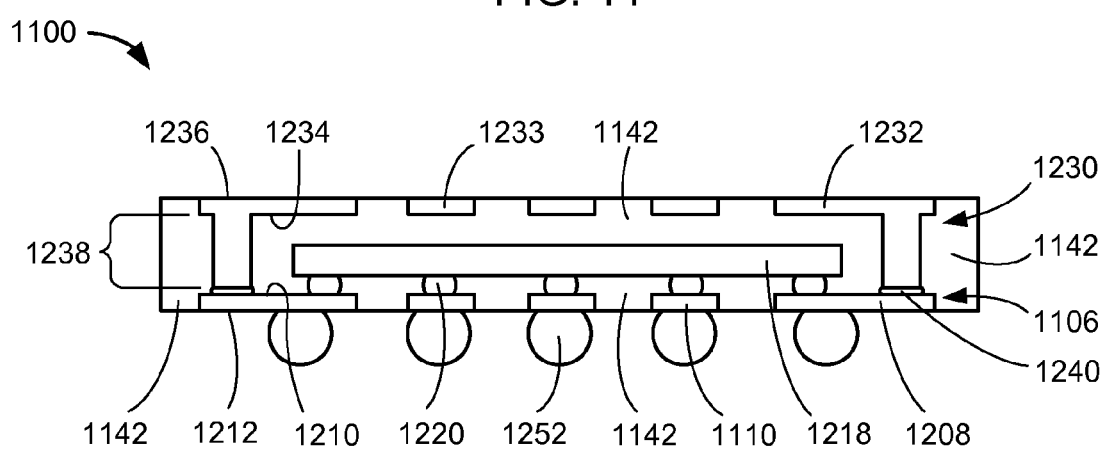
FIG. 12 is a cross-sectional view of the integrated circuit packaging system along a section line 12-12 of FIG. 11.

Referring now to FIG. 12, therein is shown a cross-sectional view of the integrated circuit packaging system along a section line 12-12 of FIG. 11. The first terminal 1106 can include a first horizontal portion 1208. The first horizontal portion 1208 can include the first lead 1108 of FIG. 11, the first pad 1110, and the first trace 1112 of FIG. 11.

The first horizontal portion 1208 can be partially exposed from the encapsulation 1142. The first horizontal portion 1208 can have a first non-exposed side 1210 and a first exposed side 1212 opposite the first non-exposed side 1210.

The first non-exposed side 1210 is covered by or within the encapsulation 1142. The first exposed side 1212 is exposed from the encapsulation 1142. The first exposed side 1212 can be coplanar with the encapsulation 1142.

An integrated circuit 1218, more specifically a flip-chip, an integrated circuit die, or a semiconductor device, can be mounted over the first non-exposed side 1210. The integrated circuit 1218 can be above a plane of the first non-exposed side 1210. The integrated circuit 1218 can be attached to the first non-exposed side 1210 with an internal connector 1220, more specifically a ball, a bump, or a connector.

The internal connector 1220 can be connected to the first horizontal portion 1208 and the integrated circuit 1218. The internal connector 1220 can be connected to the first non-exposed side 1210.

The integrated circuit packaging system 1100 can include a second terminal 1230, defined as an interconnect that provides electrical connectivity to external systems. The second terminal 1230 can include a second horizontal portion 1232.

The second horizontal portion 1232 can include a second lead electrically connected to a second pad 1233 with a second trace. For illustrative purposes, the second horizontal portion 1232 is shown adjacent to the second pad 1233 of another of the second horizontal portion 1232.

The second lead is more specifically a bond finger, a lead finger, or a contact pad. The second pad 1233 is more specifically a contact pad, a lead, or an electrical contact. The second pad 1233 can be formed in an area array or a peripheral array adjacent to the second lead.

The second trace is more specifically a signal trace or a wire. The second trace can be formed in different configurations.

For example, the second trace can be formed with different lengths. A length of the second trace can be predetermined based on locations of the second lead and the second pad 1233, a distance between the second lead and the second pad 1233, a routing area that is used to form the second trace, or a combination thereof.

The second horizontal portion 1232 can have a second non-exposed side 1234 and a second exposed side 1236 opposite the second non-exposed side 1234. The second non-exposed side 1234 is covered by or within the encapsulation 1142. The second exposed side 1236 is exposed from the encapsulation 1142. The second exposed side 1236 can be coplanar with the encapsulation 1142.

The second terminal 1230 can include a second vertical conductive post 1238, more specifically a metal post, a vertical interconnect (also known as a z-interconnect), a pillar, a column, or a conductive connector. The second vertical conductive post 1238 can be connected to the second horizontal portion 1232.

The second vertical conductive post 1238 can be integral with the second horizontal portion 1232. In other words, the second vertical conductive post 1238 and the second horizontal portion 1232 can be formed of a common material having characteristics being formed from a single integral structure or a solid structure.

The second terminal 1230 can be mounted over the first terminal 1106 and the integrated circuit 1218. The second vertical conductive post 1238 adjacent to the integrated circuit 1218 can be mounted over the first horizontal portion 1208.

The second terminal 1230 can be attached to the first horizontal portion 1208 with a conductive material 1240, more specifically a paste or an adhesive that is used to form a joint. For example, the conductive material 1240 can be a solder paste, a metallic paste, or a conductive adhesive.

The conductive material 1240 can be formed to provide electrical connectivity between the first horizontal portion 1208 and the second terminal 1230. The conductive material 1240 can be connected to the first non-exposed side 1210 and the second vertical conductive post 1238.

The encapsulation 1142 can be formed over the first terminal 1106. The encapsulation 1142 can be formed to encapsulate or cover the integrated circuit 1218, the internal connector 1220, the second vertical conductive post 1238, and the conductive material 1240.

The encapsulation 1142 can be formed leaving portions of the first terminal 1106 and the second terminal 1230 exposed. The first horizontal portion 1208 and the second horizontal portion 1232 can be partially exposed from the encapsulation 1142.

The integrated circuit packaging system 1100 can optionally include an external interconnect 1252, more specifically a ball, a bump, or a connector. The external interconnect 1252 can be attached to the first exposed side 1212 to provide connectivity to external systems (not shown).

Another of the first terminal 1106 can be formed adjacent to the first terminal 1106. The integrated circuit 1218 can be mounted partially over the first horizontal portion 1208 of the first terminal 1106 and a first horizontal portion 1208 of the another of the first terminal 1106. The integrated circuit 1218 can be connected to a first non-exposed side 1210 of the first horizontal portion 1208 of the another of the first terminal 1106 with another of the internal connector 1220.

Another of the second terminal 1230 can be formed adjacent to the second terminal 1230. The second horizontal portion 1232 of the second terminal 1230 and a second horizontal portion 1232 of the another of the second terminal 1230 can be mounted partially over the integrated circuit 1218.

Figure 13:
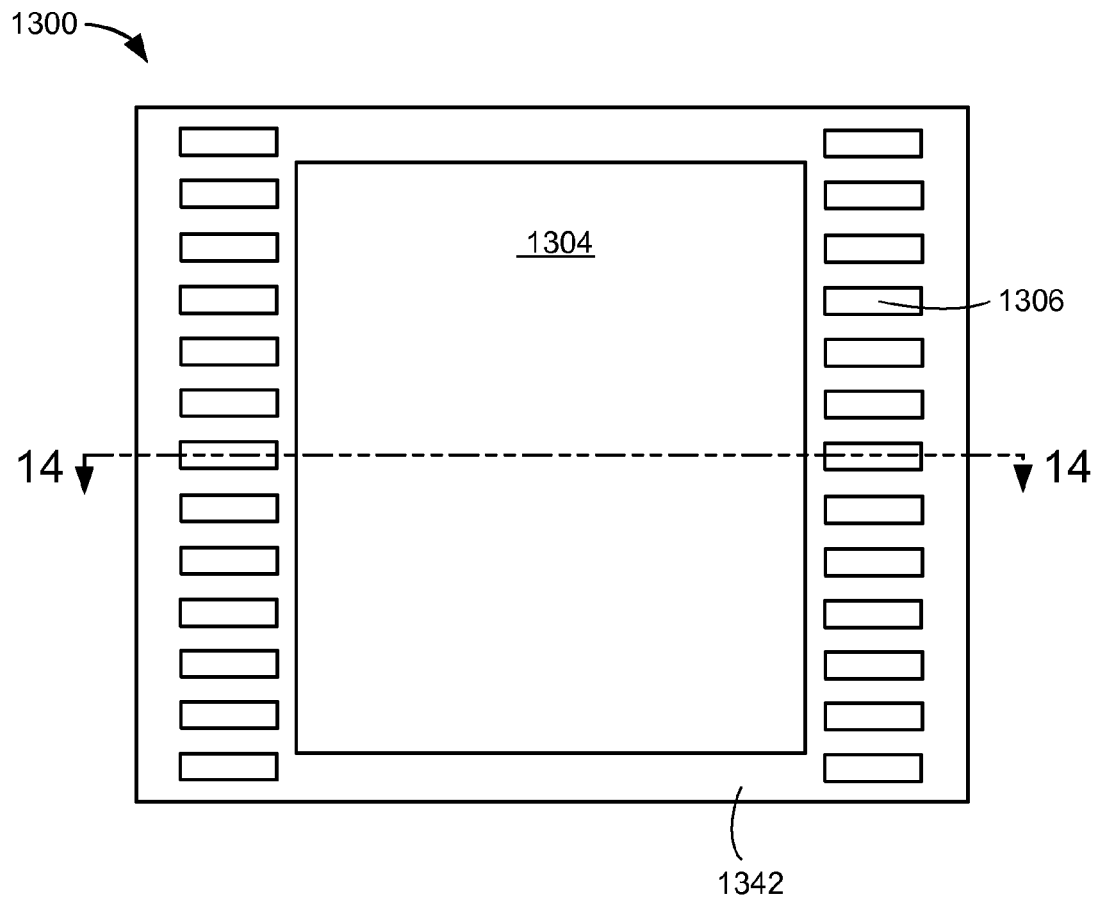
FIG. 13 is a bottom view of an integrated circuit packaging system in a sixth embodiment of the present invention.

Referring now to FIG. 13, therein is shown a bottom view of an integrated circuit packaging system 1300 in a sixth embodiment of the present invention. The integrated circuit packaging system 1300 can represent a configuration of a packaging system, which can include a dual face package-on-package (PoP) system with dual strip-etch leadframes and bottom and top fan-out contact pads. For illustrative purposes, the bottom view is shown without a connector for providing connectivity to external systems.

The integrated circuit packaging system 1300 can include a package paddle 1304, more specifically a die paddle, a die-attach paddle (DAP), or a die pad. The integrated circuit packaging system 1300 can include a first terminal 1306, defined as an interconnect that provides electrical connectivity to external systems. The first terminal 1306 can include a lead, a bond finger, a lead finger, or a contact pad.

The integrated circuit packaging system 1300 can include an encapsulation 1342, more specifically a cover including an epoxy molding compound (EMC) or a molding material. The first terminal 1306 and the package paddle 1304 can be partially exposed from the encapsulation 1342.

The first terminal 1306 can be formed in a row. For illustrative purposes, the first terminal 1306 is shown in two rows along sides of the encapsulation 1342, although the first terminal 1306 can be formed in a different configuration. For example, the first terminal 1306 can be formed in four rows along the sides.

Figure 14:
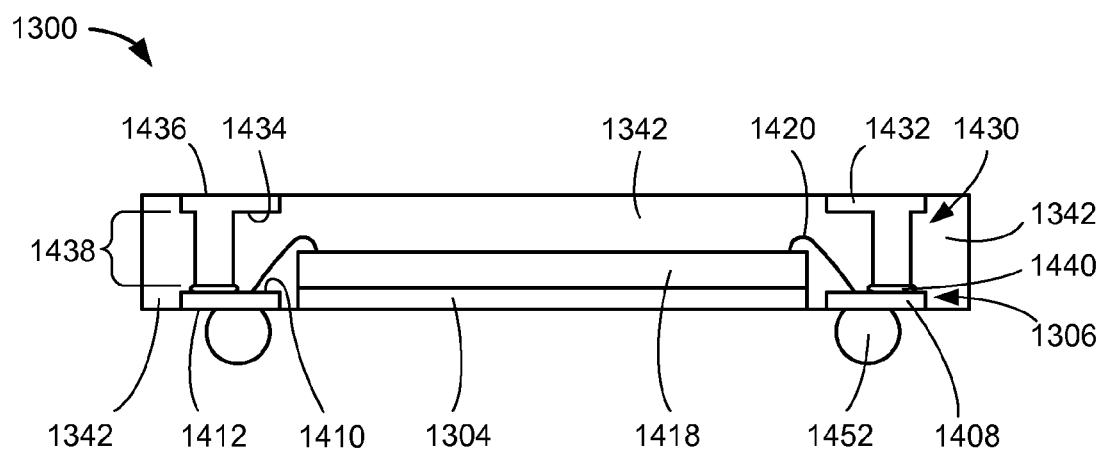
FIG. 14 is a cross-sectional view of the integrated circuit packaging system along a section line 14-14 of FIG. 13.

Referring now to FIG. 14, therein is shown a cross-sectional view of the integrated circuit packaging system 1300 along a section line 14-14 of FIG. 13. The package paddle 1304 can be formed adjacent to the first terminal 1306. The first terminal 1306 can include a first horizontal portion 1408.

The first horizontal portion 1408 can have a first non-exposed side 1410 and a first exposed side 1412 opposite the first non-exposed side 1410. The first non-exposed side 1410 is covered by or within the encapsulation 1342. The first exposed side 1412 is exposed from the encapsulation 1342. The first exposed side 1412 can be coplanar with the encapsulation 1342.

An integrated circuit 1418, more specifically an integrated circuit die, a wirebond integrated circuit, or a chip, can be mounted over the package paddle 1304. The integrated circuit 1418 can be above a plane of the first non-exposed side 1410. The integrated circuit 1418 can be attached to the package paddle 1304.

An internal connector 1420, more specifically a bond wire, a ribbon bond wire, or a conductive wire, can be connected to the first horizontal portion 1408 and the integrated circuit 1418. The internal connector 1420 can be connected to the first non-exposed side 1410.

The integrated circuit packaging system 1300 can include a second terminal 1430, defined as an interconnect that provides electrical connectivity to external systems. The second terminal 1430 can include a second horizontal portion 1432. The second horizontal portion 1432 can include a second lead, more specifically a bond finger, a lead finger, or a contact pad.

The second horizontal portion 1432 can have a second non-exposed side 1434 and a second exposed side 1436 opposite the second non-exposed side 1434. The second non-exposed side 1434 is covered by or within the encapsulation 1342. The second exposed side 1436 is exposed from the encapsulation 1342. The second exposed side 1436 can be coplanar with the encapsulation 1342.

The second terminal 1430 can include a second vertical conductive post 1438, more specifically a metal post, a vertical interconnect (also known as a z-interconnect), a pillar, a column, or a conductive connector. The second vertical conductive post 1438 can be connected to the second horizontal portion 1432.

The second vertical conductive post 1438 can be integral with the second horizontal portion 1432. In other words, the second vertical conductive post 1438 and the second horizontal portion 1432 can be formed of a common material having characteristics being formed from a single integral structure or a solid structure.

The second terminal 1430 can be mounted over the first horizontal portion 1408. The second terminal 1430 can be attached to the first horizontal portion 1408 with a conductive material 1440, more specifically a paste or an adhesive that is used to form a joint. For example, the conductive material 1440 can be a solder paste, a metallic paste, or a conductive adhesive.

The conductive material 1440 can be formed to provide electrical connectivity between the first terminal 1306 and the second terminal 1430. The conductive material 1440 can be connected to the first horizontal portion 1408 and the second vertical conductive post 1438.

The encapsulation 1342 can be formed over the first terminal 1306. The encapsulation 1342 can be formed to encapsulate or cover the integrated circuit 1418, the internal connector 1420, the second vertical conductive post 1438, and the conductive material 1440.

The encapsulation 1342 can be formed leaving portions of the package paddle 1304, the first terminal 1306, and the second terminal 1430 exposed. The first horizontal portion 1408 and the second horizontal portion 1432 can be partially exposed from the encapsulation 1342.

The integrated circuit packaging system 1300 can optionally include an external interconnect 1452, more specifically a ball, a bump, or a connector. The external interconnect 1452 can be attached to the first exposed side 1412 to provide connectivity to external systems (not shown).

The first horizontal portion 1408 can be formed adjacent to the integrated circuit 1418. The second horizontal portion 1432 can be formed over the first horizontal portion 1408 and around the integrated circuit 1418.

Figure 15:
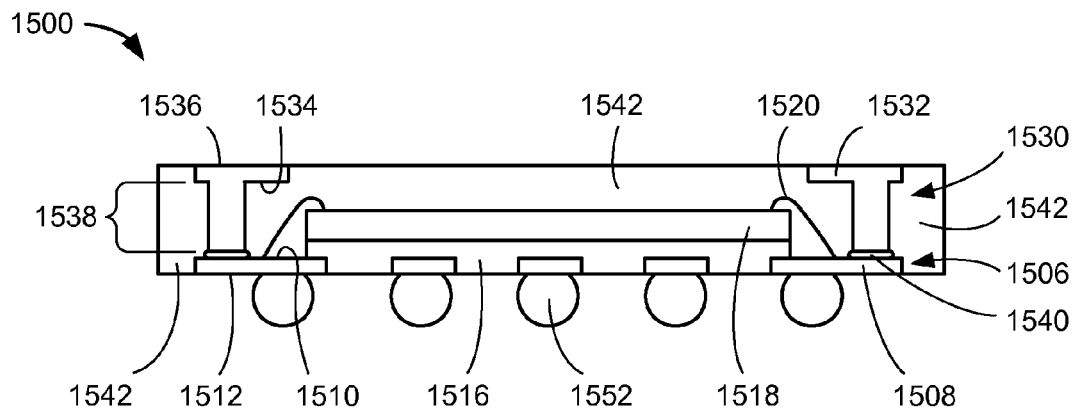
FIG. 15 is a cross-sectional view as exemplified by the bottom view of FIG. 1 of an integrated circuit packaging system in a seventh embodiment of the present invention.

Referring now to FIG. 15, therein is shown a cross-sectional view as exemplified by the bottom view of FIG. 1 of an integrated circuit packaging system 1500 in a seventh embodiment of the present invention. The integrated circuit packaging system 1500 can represent a configuration of a packaging system, which can include a dual face package-on-package (PoP) system with dual strip-etch leadframes and bottom fan-in contact pads. The integrated circuit packaging system 1500 can be formed in a manner similar to the integrated circuit packaging system 100 of FIG. 1, except for the formation of the second terminal 230 of FIG. 2.

The integrated circuit packaging system 1500 can include a first terminal 1506 having a first horizontal portion 1508. The first horizontal portion 1508 can have a first non-exposed side 1510 and a first exposed side 1512. The first terminal 1506 can be formed in a manner similar to the first terminal 106 of FIG. 1.

The integrated circuit packaging system 1500 can include an attach layer 1516, an integrated circuit 1518, and an internal connector 1520. The attach layer 1516, the integrated circuit 1518, and the internal connector 1520 can be formed in a manner similar to the attach layer 116 of FIG. 1, the integrated circuit 218 of FIG. 2, and the internal connector 220 of FIG. 2, respectively.

The integrated circuit packaging system 1500 can include a second terminal 1530. The second terminal 1530 can include a second horizontal portion 1532 having a second lead (not shown), more specifically a bond finger, a lead finger, or a contact pad. The second horizontal portion 1532 can have a second non-exposed side 1534 and a second exposed side 1536 opposite the second non-exposed side 1534.

The second terminal 1530 can include a second vertical conductive post 1538, more specifically a metal post, a vertical interconnect (also known as a z-interconnect), a pillar, a column, or a conductive connector. The second vertical conductive post 1538 can be connected to the second horizontal portion 1532.

The second vertical conductive post 1538 can be integral with the second horizontal portion 1532. In other words, the second vertical conductive post 1538 and the second horizontal portion 1532 can be formed of a common material having characteristics being formed from a single integral structure or a solid structure.

The second vertical conductive post 1538 adjacent to the integrated circuit 1518 can be mounted over the first horizontal portion 1508. The second vertical conductive post 1538 can be attached to the first horizontal portion 1508 with a conductive material 1540. The conductive material 1540 can be formed in a manner similar to the conductive material 240 of FIG. 2.

With the second terminal 1530 and the internal connector 1520 connected to the first horizontal portion 1508, the second terminal 1530 can be electrically connected to the internal connector 1520.

The integrated circuit packaging system 1500 can include an encapsulation 1542. The encapsulation 1542 can be formed in a manner similar to the encapsulation 142 of FIG. 1.

The second non-exposed side 1534 is covered by or within the encapsulation 1542. The second exposed side 1536 is exposed from the encapsulation 1542. The second exposed side 1536 can be coplanar with the encapsulation 1542.

The encapsulation 1542 can be formed leaving portions of the first terminal 1506 and the second terminal 1530 exposed. The second horizontal portion 1532 can be partially exposed from the encapsulation 1542.

The integrated circuit packaging system 1500 can optionally include an external interconnect 1552. The external interconnect 1552 can be formed in a manner similar to the external interconnect 252 of FIG. 2.

Another of the first terminal 1506 can be formed adjacent to the first terminal 1506. The integrated circuit 1518 can be mounted partially over the first horizontal portion 1508 of the first terminal 1506 and a first horizontal portion 1508 of the another of the first terminal 1506.

The integrated circuit 1518 can be connected to a first non-exposed side 1510 of the first horizontal portion 1508 of the another of the first terminal 1506 with another of the internal connector 1520. The second horizontal portion 1532 can be formed over the first horizontal portion 1508 and around the integrated circuit 1518.

Figure 16:
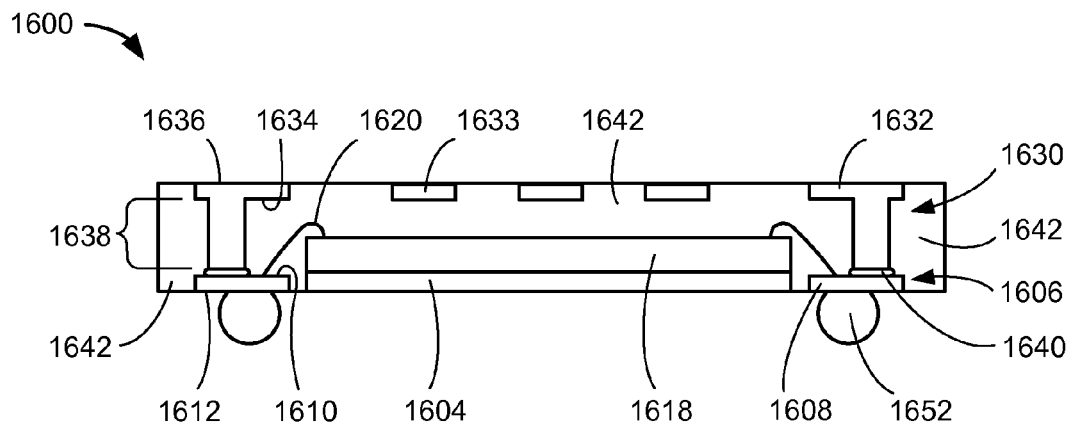
FIG. 16 is a cross-sectional view as exemplified by the bottom view of FIG. 13 of an integrated circuit packaging system in an eighth embodiment of the present invention.

Referring now to FIG. 16, therein is shown a cross-sectional view as exemplified by the bottom view of FIG. 13 of an integrated circuit packaging system 1600 in an eighth embodiment of the present invention. The integrated circuit packaging system 1600 can represent a configuration of a packaging system, which can include a dual face package-on-package (PoP) system with dual strip-etch leadframes and top fan-in contact pads. The integrated circuit packaging system 1600 can be formed in a manner similar to the integrated circuit packaging system 1300 of FIG. 13, except for the formation of the second terminal 1430 of FIG. 14.

The integrated circuit packaging system 1600 can include a package paddle 1604 and a first terminal 1606 having a first horizontal portion 1608. The first horizontal portion 1608 can have a first non-exposed side 1610 and a first exposed side 1612 opposite the first non-exposed side 1610.

The integrated circuit packaging system 1600 can include an integrated circuit 1618 and an internal connector 1620. The package paddle 1604, the first terminal 1606, the integrated circuit 1618, and the internal connector 1620 can be formed in a manner similar to the package paddle 1304 of FIG. 13, the first terminal 1306 of FIG. 13, the integrated circuit 1418 of FIG. 14, and the internal connector 1420 of FIG. 14, respectively.

The integrated circuit packaging system 1600 can include a second terminal 1630. The second terminal 1630 can include a second horizontal portion 1632.

The second horizontal portion 1632 can include a second lead electrically connected to a second pad 1633 with a second trace. For illustrative purposes, the second horizontal portion 1632 is shown adjacent to the second pad 1633 of another of the second horizontal portion 1632.

The second lead is more specifically a bond finger, a lead finger, or a contact pad. The second pad 1633 is more specifically a contact pad, a lead, or an electrical contact. The second pad 1633 can be formed in an area array or a peripheral array adjacent to the second lead.

The second trace is more specifically a signal trace or a wire. The second trace can be formed in different configurations.

For example, the second trace can be formed with different lengths. A length of the second trace can be predetermined based on locations of the second lead and the second pad 1633, a distance between the second lead and the second pad 1633, a routing area that is used to form the second trace, or a combination thereof.

The second horizontal portion 1632 can have a second non-exposed side 1634 and a second exposed side 1636 opposite the second non-exposed side 1634.

The second terminal 1630 can include a second vertical conductive post 1638, more specifically a metal post, a vertical interconnect (also known as a z-interconnect), a pillar, a column, or a conductive connector. The second vertical conductive post 1638 can be connected to the second horizontal portion 1632.

The second vertical conductive post 1638 can be integral with the second horizontal portion 1632. In other words, the second vertical conductive post 1638 and the second horizontal portion 1632 can be formed of a common material having characteristics being formed from a single integral structure or a solid structure.

The second terminal 1630 can be mounted over the first horizontal portion 1608 and the integrated circuit 1618. The second terminal 1630 can be attached to the first horizontal portion 1608 with a conductive material 1640.

The conductive material 1640 can be formed in a manner similar to the conductive material 1440 of FIG. 14. With the conductive material 1640 attached to the second vertical conductive post 1638 and the first horizontal portion 1608, the second horizontal portion 1632 that is over the integrated circuit 1618 can be connected to the first terminal 1606.

The integrated circuit packaging system 1600 can include an encapsulation 1642. The integrated circuit packaging system 1600 can optionally include an external interconnect 1652. The encapsulation 1642 and the external interconnect 1652 can be formed in a manner similar to the encapsulation 1342 of FIG. 13 and the external interconnect 1452 of FIG. 14, respectively.

The second non-exposed side 1634 is covered by or within the encapsulation 1642. The second exposed side 1636 is exposed from the encapsulation 1642. The second exposed side 1636 can be coplanar with the encapsulation 1642.

The first horizontal portion 1608 can be formed adjacent to the integrated circuit 1618. Another of the second terminal 1630 can be formed adjacent to the second terminal 1630. The second horizontal portion 1632 of the second terminal 1630 and a second horizontal portion 1632 of the another of the second terminal 1630 can be mounted partially over the integrated circuit 1618.

Figure 17:
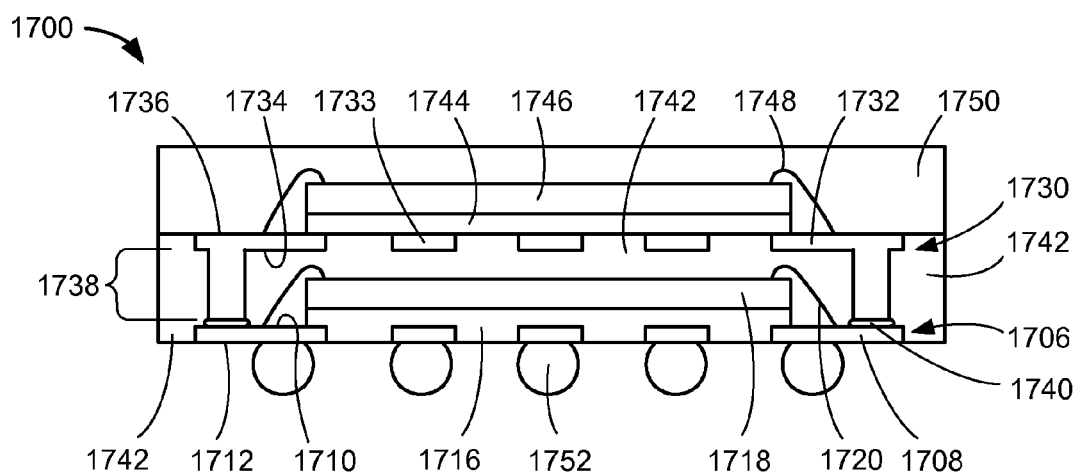
FIG. 17 is a cross-sectional view as exemplified by the bottom view of FIG. 1 of an integrated circuit packaging system in a ninth embodiment of the present invention.

Referring now to FIG. 17, therein is shown a cross-sectional view as exemplified by the bottom view of FIG. 1 of an integrated circuit packaging system 1700 in a ninth embodiment of the present invention. The integrated circuit packaging system 1700 can represent a configuration of a packaging system, which can include a dual face package-on-package (PoP) system with dual strip-etch leadframes and dual molds. The integrated circuit packaging system 1700 can be formed in a manner similar to the integrated circuit packaging system 100 of FIG. 1, except for an addition of another integrated circuit.

The integrated circuit packaging system 1700 can include a first terminal 1706 having a first horizontal portion 1708. The first horizontal portion 1708 can have a first non-exposed side 1710 and a first exposed side 1712. The first terminal 1706 can be formed in a manner similar to the first terminal 106 of FIG. 1.

The integrated circuit packaging system 1700 can include an attach layer 1716, an integrated circuit 1718, and an internal connector 1720. The attach layer 1716, the integrated circuit 1718, and the internal connector 1720 can be formed in a manner similar to the attach layer 116 of FIG. 1, the integrated circuit 218 of FIG. 2, and the internal connector 220 of FIG. 2, respectively.

The integrated circuit packaging system 1700 can include a second terminal 1730 having a second horizontal portion 1732. The second horizontal portion 1732 can include a second lead, a second pad 1733, and a second trace. The second horizontal portion 1732 can have a second non-exposed side 1734 and a second exposed side 1736.

The second terminal 1730 can include a second vertical conductive post 1738. The second terminal 1730 can be formed in a manner similar to the second terminal 230 of FIG. 2.

The integrated circuit packaging system 1700 can include a conductive material 1740 and an encapsulation 1742. The conductive material 1740 and the encapsulation 1742 can be formed in a manner similar to the conductive material 240 of FIG. 2 and the encapsulation 142 of FIG. 1, respectively.

The integrated circuit packaging system 1700 can include a stack attach layer 1744, more specifically a film, an epoxy, or an adhesive, formed over the second terminal 1730 and the encapsulation 1742. A stack integrated circuit 1746, more specifically an integrated circuit die, a wirebond integrated circuit, or a chip, can be mounted over the second terminal 1730 with the stack attach layer 1744. The stack integrated circuit 1746 can be mounted over the second horizontal portion 1732.

A stack internal connector 1748, more specifically a bond wire, a ribbon bond wire, or a conductive wire, can be connected to the second terminal 1730 and the stack integrated circuit 1746. The stack internal connector 1748 can be connected to the second horizontal portion 1732.

The integrated circuit packaging system 1700 can include a stack encapsulation 1750, more specifically a cover including an epoxy molding compound (EMC) or a molding material. The stack encapsulation 1750 can be formed over the second terminal 1730 encapsulating or covering the stack attach layer 1744, the stack integrated circuit 1746, and the stack internal connector 1748.

The integrated circuit packaging system 1700 can include an external interconnect 1752. The external interconnect 1752 can be formed in a manner similar to the external interconnect 252 of FIG. 2.

Another of the first terminal 1706 can be formed adjacent to the first terminal 1706. The integrated circuit 1718 can be mounted partially over the first horizontal portion 1708 of the first terminal 1706 and a first horizontal portion 1708 of the another of the first terminal 1706. The integrated circuit 1718 can be connected to a first non-exposed side 1710 of the first horizontal portion 1708 of the another of the first terminal 1706 with another of the internal connector 1720.

Another of the second terminal 1730 can be formed adjacent to the second terminal 1730. The second horizontal portion 1732 of the second terminal 1730 and a second horizontal portion 1732 of the another of the second terminal 1730 can be mounted partially over the integrated circuit 1718.

Figure 18:
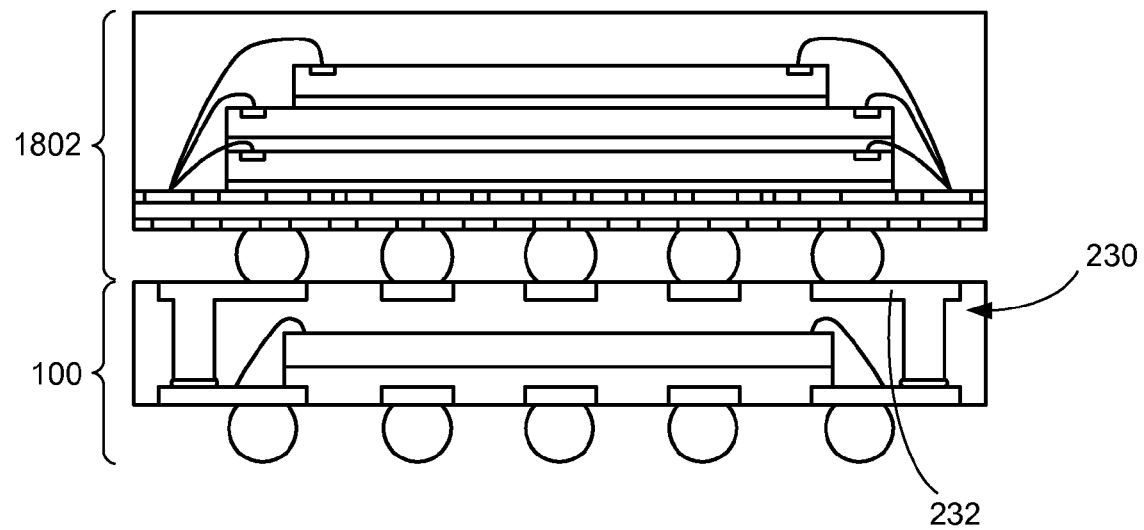
FIG. 18 is a cross-sectional view as exemplified by the bottom view of FIG. 1 of a first application example of the present invention.

Referring now to FIG. 18, therein is shown a cross-sectional view as exemplified by the bottom view of FIG. 1 of a first application example of the present invention. The first application example can include a stack integrated circuit packaging system 1802 mounted over the integrated circuit packaging system 100.

The stack integrated circuit packaging system 1802 can be mounted over the second terminal 230 of the integrated circuit packaging system 100. The stack integrated circuit packaging system 1802 can be mounted over the second horizontal portion 232 of the second terminal 230.

As an example, the stack integrated circuit packaging system 1802 can include a substrate with a number of integrated circuits mounted thereover and connected thereto. As another example, the stack integrated circuit packaging system 1802 can be connected to the integrated circuit packaging system 100 with an interconnect, such as a ball, a bump, or a connector, which can be formed with solder, an alloy, or a conductive material.

Figure 19:
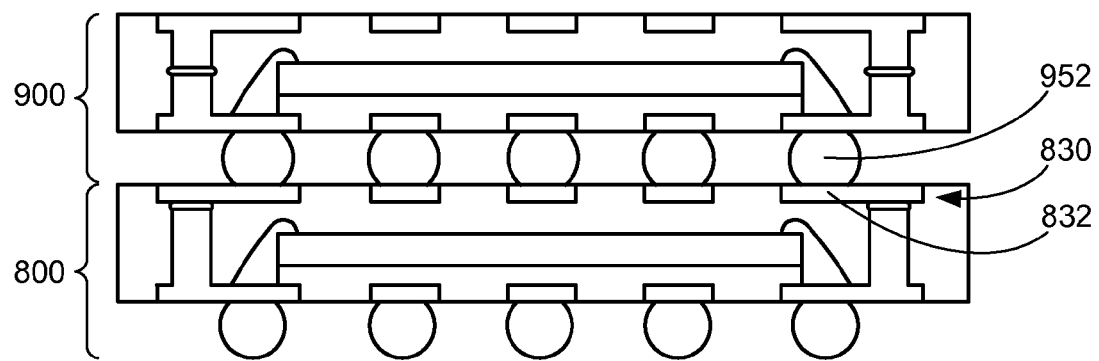
FIG. 19 is a cross-sectional view as exemplified by the bottom view of FIG. 1 of a second application example of the present invention.

Referring now to FIG. 19, therein is shown a cross-sectional view as exemplified by the bottom view of FIG. 1 of a second application example of the present invention. The second application example can include the integrated circuit packaging system 900 mounted over the integrated circuit packaging system 800.

The integrated circuit packaging system 900 can be mounted over the second terminal 830 of the integrated circuit packaging system 800. The external interconnect 952 of the integrated circuit packaging system 900 can be connected to the second horizontal portion 832 of the second terminal 830.

Figure 20:
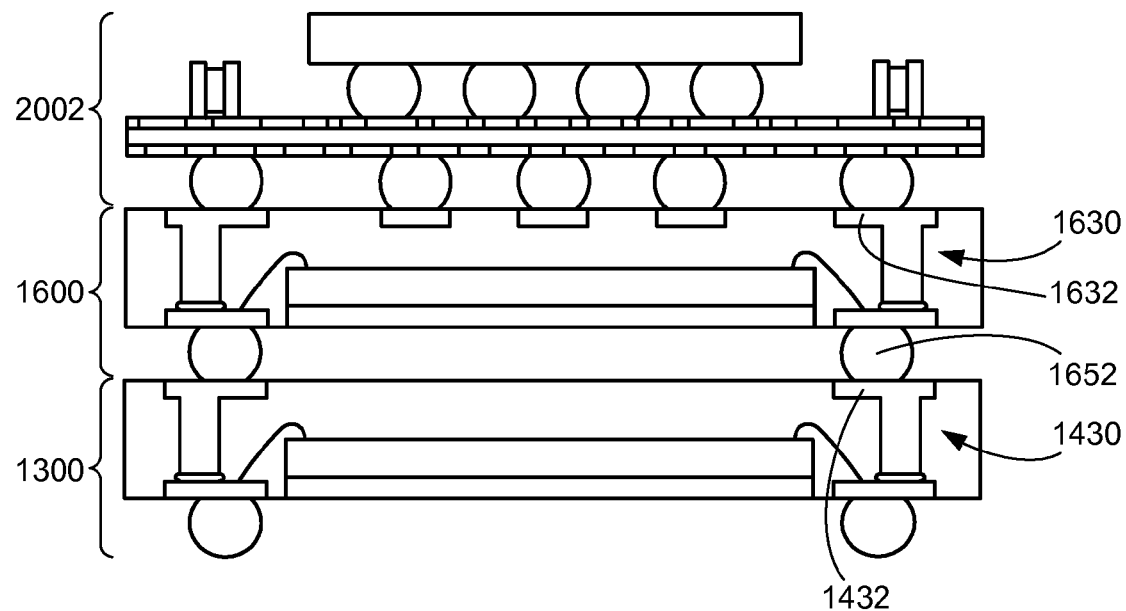
FIG. 20 is a cross-sectional view as exemplified by the bottom view of FIG. 13 of a third application example of the present invention.

Referring now to FIG. 20, therein is shown a cross-sectional view as exemplified by the bottom view of FIG. 13 of a third application example of the present invention. The third application example can include the integrated circuit packaging system 1600 mounted over the integrated circuit packaging system 1300.

The integrated circuit packaging system 1600 can be mounted over the second terminal 1430 of the integrated circuit packaging system 1300. The external interconnect 1652 of the integrated circuit packaging system 1600 can be connected to the second horizontal portion 1432 of the second terminal 1430.

The third application example can include a stack integrated circuit packaging system 2002 mounted over the integrated circuit packaging system 1600. The stack integrated circuit packaging system 2002 can be mounted over the second terminal 1630 of the integrated circuit packaging system 1600. The stack integrated circuit packaging system 2002 can be mounted over the second horizontal portion 1632 of the second terminal 1630.

As an example, the stack integrated circuit packaging system 2002 can include a substrate with a number of devices, such as a flip chip, a passive component, a semiconductor device, or an integrated circuit package, mounted thereover and connected thereto. As another example, the stack integrated circuit packaging system 2002 can be connected to the integrated circuit packaging system 1600 with an interconnect, such as a ball, a bump, or a connector, which can be formed with solder, an alloy, or a conductive material.

Figure 21:
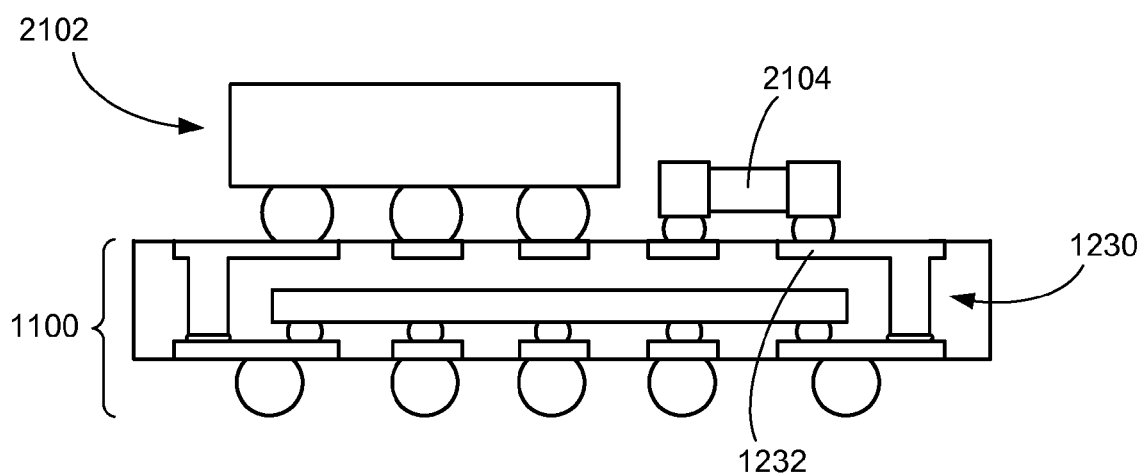
FIG. 21 is a cross-sectional view as exemplified by the bottom view of FIG. 11 of a fourth application example of the present invention.

Referring now to FIG. 21, therein is shown a cross-sectional view as exemplified by the bottom view of FIG. 11 of a fourth application example of the present invention. The fourth application example can include a stack integrated circuit packaging system 2102 and a component 2104 mounted over the integrated circuit packaging system 1100.

The stack integrated circuit packaging system 2102 and the component 2104 can be mounted over the second terminal 1230 of the integrated circuit packaging system 1100. The stack integrated circuit packaging system 2102 and the component 2104 can be mounted over the second horizontal portion 1232 of the second terminal 1230.

As an example, the stack integrated circuit packaging system 2102 can include a device, such as a flip chip, a semiconductor device, or an integrated circuit package. As another example, the component 2104 can include a passive device or a discrete component. As yet another example, the stack integrated circuit packaging system 2102 and the component 2104 can be connected to the integrated circuit packaging system 1100 with an interconnect, such as a ball, a bump, or a connector, which can be formed with solder, an alloy, or a conductive material.

Figure 22:
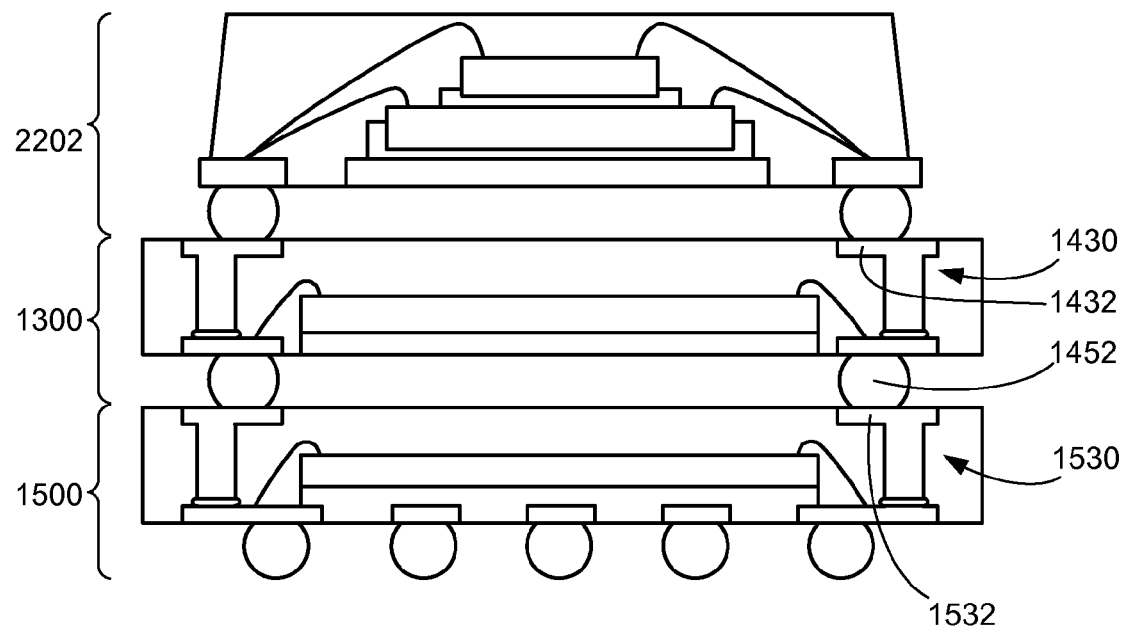
FIG. 22 is a cross-sectional view as exemplified by the bottom view of FIG. 1 of a fifth application example of the present invention.

Referring now to FIG. 22, therein is shown a cross-sectional view as exemplified by the bottom view of FIG. 1 of a fifth application example of the present invention. The fifth application example can include the integrated circuit packaging system 1300 mounted over the integrated circuit packaging system 1500.

The integrated circuit packaging system 1300 can be mounted over the second terminal 1530 of the integrated circuit packaging system 1500. The external interconnect 1452 of the integrated circuit packaging system 1300 can be connected to the second horizontal portion 1532 of the second terminal 1530.

The fifth application example can include a stack integrated circuit packaging system 2202 mounted over the integrated circuit packaging system 1300. The stack integrated circuit packaging system 2202 can be mounted over the second terminal 1430 of the integrated circuit packaging system 1300. The stack integrated circuit packaging system 2202 can be mounted over the second horizontal portion 1432 of the second terminal 1430.

As an example, the stack integrated circuit packaging system 2202 can include a die-attach paddle, leads, and a number of integrated circuits mounted over the die-attach paddle and connected to the leads. As another example, the stack integrated circuit packaging system 2202 can be connected to the integrated circuit packaging system 1300 with an interconnect, such as a ball, a bump, or a connector, which can be formed with solder, an alloy, or a conductive material.

Figure 23:
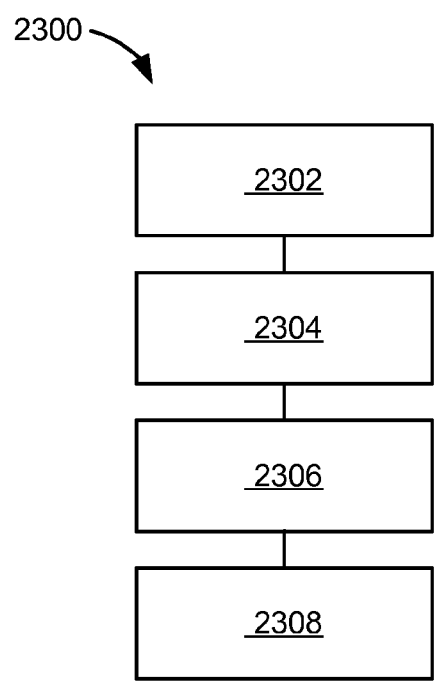
FIG. 23 is a flow chart of a method of manufacture of the integrated circuit packaging system in a further embodiment of the present invention.

Referring now to FIG. 23, therein is shown a flow chart of a method 2300 of manufacture of the integrated circuit packaging system 100 in a further embodiment of the present invention. The method 2300 includes: forming a first terminal in a block 2302; connecting an integrated circuit to the first terminal in a block 2304; forming a second terminal connected over the first terminal and the integrated circuit by a vertical conductive post integral with the first terminal or the second terminal in a block 2306; and encapsulating the integrated circuit and the vertical conductive post leaving portions of the first terminal and the second terminal exposed in a block 2308.

The present invention can include an integrated circuit packaging system having a structure with a combination of key features or embodiments previously described. The present invention can include an electrical component mounted over one of the embodiments. The present invention can include one of the embodiments mounted over a fan-out package-on-package packaging (PoP) system or a fan-in package-on-package packaging (PoP) system.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description.

Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   forming a first leadframe including first terminals;
   connecting an integrated circuit to the first terminals;
   forming a second leadframe including second terminals connected over the first terminals and the integrated circuit by vertical conductive posts integral with the first terminals or the second terminals;
   encapsulating the integrated circuit and the vertical conductive posts leaving portions of the first terminals and the second terminals exposed;
   forming the first terminals includes forming the first terminals having a cavity ring; and
   forming the second terminals includes forming the second terminals connected over the first terminals and the integrated circuit by the vertical conductive posts surrounded by the cavity ring.

2. The method as claimed in claim 1 wherein forming the second terminals connected over the first terminals includes connecting a conductive material to the first terminals and the vertical conductive posts.

3. The method as claimed in claim 1 wherein forming the second terminals connected over the first terminals includes connecting first vertical conductive posts and second vertical conductive posts, the first vertical conductive posts integral with the first terminals and the second vertical conductive posts integral with the second terminals.

4. A method of manufacture of an integrated circuit packaging system comprising:
   forming a first leadframe including first terminals;
   connecting an integrated circuit to the first terminals;
   forming a second leadframe including second terminals connected over the first terminals and the integrated circuit by vertical conductive posts integral with the first terminals or the second terminals;
   encapsulating the integrated circuit and the vertical conductive posts leaving portions of the first terminals and the second terminals exposed;
   forming the first terminals includes forming the first terminals having a recess; and
   forming the second terminals includes forming the second terminals connected over the first terminals and the integrated circuit by the vertical conductive posts in the recess.

5. The method as claimed in claim 4 wherein forming the second terminals connected over the first terminals includes connecting a conductive material to the first terminals and the vertical conductive posts.

6. The method as claimed in claim 4 wherein forming the second terminals connected over the first terminals includes connecting first vertical conductive posts and second vertical conductive posts, the first vertical conductive posts integral with the first terminals and the second vertical conductive posts integral with the second terminals.

7. An integrated circuit packaging system comprising:
   a first leadframe including first terminals;
   an integrated circuit connected to the first terminals;
   a second leadframe including second terminals over the first terminals and the integrated circuit;
   vertical conductive posts connected to each of the first terminals and the second terminals, the vertical conductive posts integral with the first terminals or the second terminals;
   an encapsulation covering the integrated circuit and the vertical conductive posts leaving portions of the first terminals and the second terminals exposed;
   wherein the first terminals have a cavity ring; and
   the vertical conductive posts are surrounded by the cavity ring.

8. The system as claimed in claim 7 wherein the vertical conductive posts connected to the first terminals and the second terminals include:
   first vertical conductive posts integral with the first terminals; and
   second vertical conductive posts connected to the first vertical conductive posts, the second vertical conductive posts integral with the second terminals.

9. The system as claimed in claim 7 wherein the vertical conductive posts are adjacent to the integrated circuit.

10. The system as claimed in claim 9 further comprising:
    the integrated circuit partially over the first terminals.

11. The system as claimed in claim 9 wherein the second terminals include a horizontal portion.

12. The system as claimed in claim 9 further comprising:
    a package paddle adjacent to the first terminals; and
    wherein:
    the integrated circuit is over the package paddle.

13. The system as claimed in claim 9 wherein the integrated circuit is a flip-chip connected to the first terminals.

14. An integrated circuit packaging system comprising:
    a first leadframe including first terminals;
    an integrated circuit connected to the first terminals;
    a second leadframe including second terminals over the first terminals and the integrated circuit;
    vertical conductive posts connected to each of the first terminals and the second terminals, the vertical conductive posts integral with the first terminals or the second terminals;
    an encapsulation covering the integrated circuit and the vertical conductive posts leaving portions of the first terminals and the second terminals exposed;
    wherein the first terminals have a recess; and
    the vertical conductive posts are in the recess.

15. The system as claimed in claim 14 wherein the vertical conductive posts connected to the first terminals and the second terminals include:
    first vertical conductive posts integral with the first terminals; and
    second vertical conductive posts connected to the first vertical conductive posts, the second vertical conductive posts integral with the second terminals.

16. The system as claimed in claim 14 wherein the vertical conductive posts are adjacent to the integrated circuit.

17. The system as claimed in claim 16 further comprising:
    the integrated circuit partially over the first terminals.

18. The system as claimed in claim 16 wherein the second terminals include a horizontal portion.

19. The system as claimed in claim 16 further comprising:
    a package paddle adjacent to the first terminals; and
    wherein:
    the integrated circuit is over the package paddle.

20. The system as claimed in claim 16 wherein the integrated circuit is a flip-chip connected to the first terminals.

* * * * *